US 7,389,461 B2

(12) United States Patent
Viens

(10) Patent No.: US 7,389,461 B2
(45) Date of Patent: Jun. 17, 2008

(54) DATA CAPTURE IN AUTOMATIC TEST EQUIPMENT

(75) Inventor: Dominic Viens, Sutton, MA (US)

(73) Assignee: Teradyne, Inc., North Reading, MA (US)

( * ) Notice: Subject to any disclaimer, the term of this patent is extended or adjusted under 35 U.S.C. 154(b) by 0 days.

(21) Appl. No.: 11/237,383

(22) Filed: Sep. 28, 2005

(65) Prior Publication Data

US 2007/0168817 A1    Jul. 19, 2007

(51) Int. Cl.
 *G01R 31/28* (2006.01)
(52) U.S. Cl. ...................................... 714/742
(58) Field of Classification Search ................ 714/724, 714/742
 See application file for complete search history.

(56) References Cited

U.S. PATENT DOCUMENTS 6,460,152 B1    10/2002  Demidov et al.
6,904,375 B1     6/2005  Sabih et al.
6,996,757 B2 *   2/2006  Evans ......................... 714/724
7,062,589 B1 *   6/2006  Crosland .................... 710/306
7,082,556 B2 *   7/2006  Fishman et al. ............ 714/704

OTHER PUBLICATIONS

International Search Report for Application No. PCT/US2006/037411.
Written Opinion for Application No. PCT/US2006/037411.

* cited by examiner

*Primary Examiner*—James C Kerveros
(74) *Attorney, Agent, or Firm*—Fish & Richardson P.C.

(57) ABSTRACT

A method for use with automatic test equipment (ATE) having a site that holds a device under test (DUT) includes receiving data from the DUT at a first rate, storing the data in a buffer, moving the data out of the buffer at a second rate, where the second rate is greater than or equal to the first rate, and where the data is moved toward a processing device, and performing a test on the data at the processing device.

16 Claims, 2 Drawing Sheets

DATA CAPTURE IN AUTOMATIC TEST EQUIPMENT

TECHNICAL FIELD

This patent application relates generally to capturing data from a device under test in automatic test equipment.

BACKGROUND

Automatic test equipment (ATE) is typically an automated, usually computer-driven, system for testing devices, such as semiconductors, electronic circuits, and printed circuit board assemblies. A device being tested is referred to as a device under test (DUT).

Modern ATEs support multi-site testing. ATEs that support multi-site testing include a testing device having slots, or "sites". A device to be tested—a DUT—is inserted into each site, and the ATE performs whatever tests are necessary on the device in the site. As part of its testing, the ATE sends signals to the DUT and receives data back from the DUT. Some types of tests require that data from the DUT be available in what is essentially a continuous stream. For example, one type of bit error test requires a data capture size of $2^{31}$ bits. Heretofore, data capture sizes of this magnitude have been difficult to achieve.

SUMMARY

This patent application describes apparatus and methods, including computer program products, for capturing data from a DUT.

In general, in one aspect, the invention is directed to a method for use with automatic test equipment (ATE) having a site that holds a device under test (DUT). The method includes receiving data from the DUT at a first rate, storing the data in a buffer, moving the data out of the buffer at a second rate, where the second rate is greater than or equal to the first rate, and where the data is moved toward a processing device, and performing a test on the data at the processing device. This aspect may include one or more of the following features.

The ATE may include a second site that holds a second DUT, and the method may include receiving second data from the DUT at a third rate, storing the second data in a second buffer that corresponds to the second site, moving the second data out of the second buffer at a fourth rate. The fourth rate may be greater than or equal to the third rate, and the second data may be moved toward the processing device. The method may also include performing a test on the second data at the processing device. The first rate may include a sampling rate for the data, and the method may include determining the second rate based on the first rate, a number of samples of the data, and a number of channels over which data is transmitted from the DUT.

The first rate may substantially equal the second rate. The buffer may be a first-in, first-out (FIFO) buffer, and may have a size that is large enough to accommodate eight megasamples of data, where a sample comprises sixteen bits of data. The method may include packetizing the data before the data reaches the processing device. The data may be packetized as the data is moved out of the buffer the test may be a bit error test.

In general, in another aspect, the invention is directed to ATE that includes a site that holds a device under test (DUT), a buffer, and a controller that executes instructions to receive data from the DUT at a first rate, store the data in the buffer, and move the data out of the buffer at a second rate, where the second rate is greater than or equal to the first rate, and where the data is moved toward a processing device. The processing device performs a test on the data. This aspect may also include any one or more of the foregoing features.

The details of one or more examples are set forth in the accompanying drawings and the description below. Further features, aspects, and advantages of the invention will become apparent from the description, the drawings, and the claims.

DESCRIPTION OF THE DRAWINGS

Like reference numerals in different figures indicate like elements.

DETAILED DESCRIPTION

Figure 1:
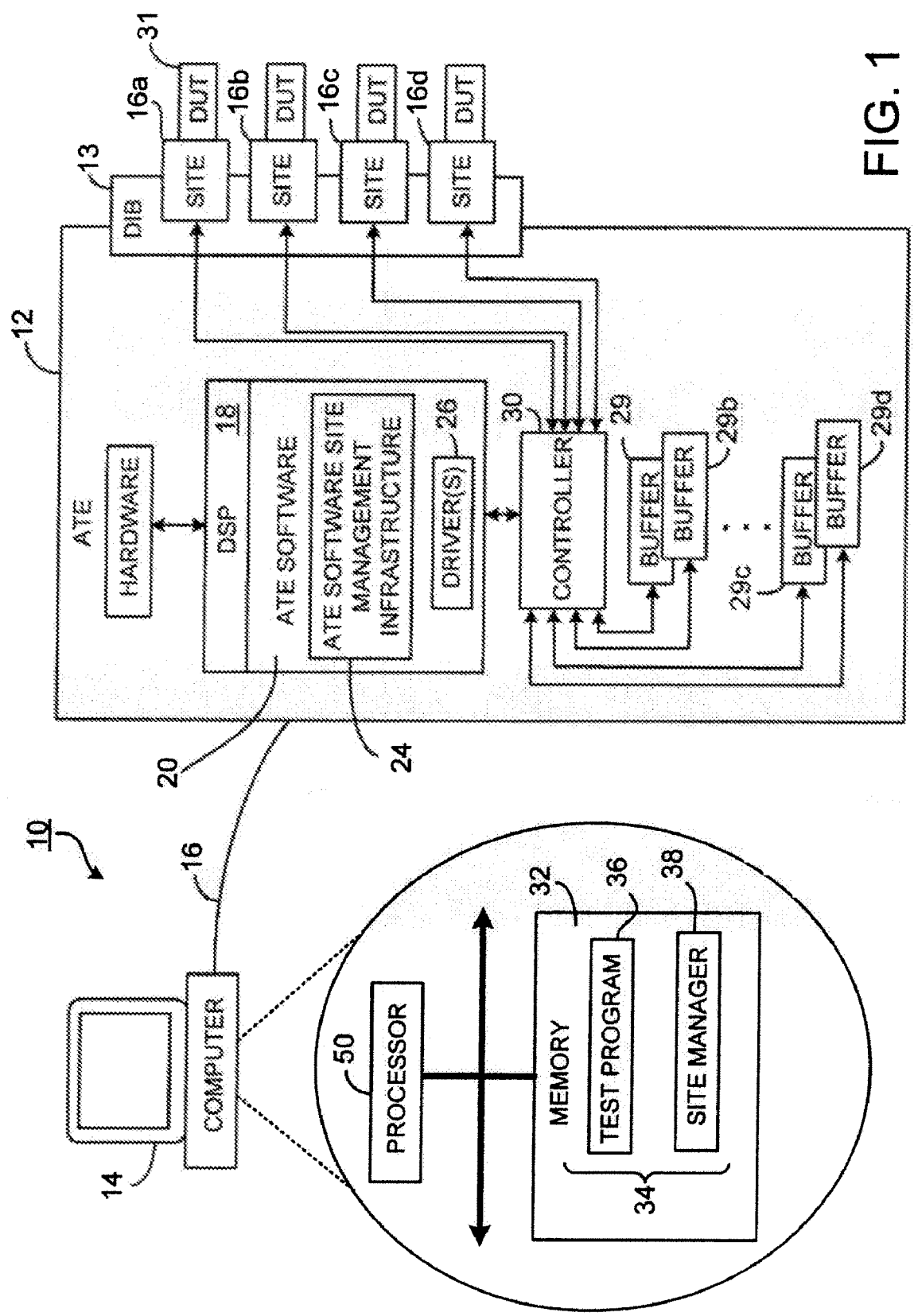
FIG. 1 is block diagram of a test system, including an ATE and a computer.

Referring to FIG. 1, a system 10 for testing a device-under-test (DUT) includes a tester 12 such as automatic test equipment (ATE) or other similar testing device. To control tester 12, system 10 includes a computer 14 that interfaces with tester 12 over a hardwire connection 16. Typically, computer 14 sends commands to tester 12 that initiate the execution of routines and functions for testing a DUT. Such executing test routines may initiate the generation and transmission of test signals to the DUT and collecting responses from the DUT. Various types of DUTs may be tested by system 10 including, e.g., semiconductor devices such as an integrated circuit (IC) chip (e.g., memory chip, microprocessor, analog-to-digital converter, digital-to-analog converter, etc.).

ATE 12 includes a device interface board (DIB) 13, which is used to connect DUTs to the ATE. DIB 13 has multiple DUTs 16a to 16d. DUTs may be separated into multiple sites for testing using the ATE. Although only four sites are shown in FIG. 1, ATE 12 may include any number of sites. Also, in the example of FIG. 1, there is one DUT per site, however, it is not a requirement that all the sites be occupied or that all sites contain only one DUT. Each DUT may be any type of device that can be tested using an ATE, such as those noted above.

ATE 12 may include an internal processing device, such as digital signal processor (DSP) 18. Alternatively, ATE 12 may include an external processing device, such as a rack mounted digital signal processor. Alternatively, ATE may only comprise of a computer 14. DSP 18 may execute all or part of ATE software 20, i.e., computer program(s) comprised of executable code, to test the DUTs in sites 16a to 16d. ATE software 20 may be stored in memory (not shown) on ATE 12, or may be provided from an external processing device, such as computer 14. ATE software 20 includes an ATE software site management infrastructure 24 that manages sites 16a to 16d, and one or more device drivers 26 for controlling hardware on ATE 12. The hardware may include analog and/or digital instrumentation for providing signals to, and receiving signals from, pins that interface to DUTs in sites 16a to 16d. Separate hardware may be provided for each site or the same hardware may be programmed to interact with one or more sites.

ATE 12 also includes a buffer 29 for receiving data from a DUT in a site. In this implementation, ATE 12 includes one such buffer per site. In other implementations, however, one buffer may accommodate multiple, or all, sites. Buffer 29 may be a first-in, first-out buffer (FIFO) that receives test data from a DUT in a site. The test data may be, e.g., response(s) to signals transmitted to the DUT via ATE 12. Buffer 29 is relatively large in order to accommodate relatively large amounts of data with relatively little data loss. In this implementation, buffer 29 is able to accommodate eight megasamples of data, where a sample is sixteen bits of data. Any size buffer, however, may be used.

In some implementations, the FIFO can be small or large and still accommodate "infinite capture sizes", i.e., streams of data that appear not to have breaks. In such implementations, the FIFO can be any size, so long as the left and right hand sides of the following equations hold true:

> Output data rate*number of output samples≧buffer size≧input data rate*number of input samples*number of channels per buffer.

That is, the output data rate of the buffer times the number of samples in the output data must be greater than or equal to the buffer size, which must be greater than or equal to the input data rate of the buffer times the number of samples in the input data times the number of channels per buffer. By controlling the input/output to the buffer thusly, the ATE can capture an unlimited amount of data from each DUT.

ATE 12 also includes a controller 30. Controller 30 may be hardware, a processor and/or programmable logic that controls transfer of data between ATE 12 and the DUTs in sites 16a to 16d. In particular, controller 30 stores data from a DUT, such as DUT 31, in buffer 29 and moves that data from buffer 29 to a destination, such as DSP 18. Controller 30 may send data unprocessed or could also packetize the data prior to transmission to its destination. Controller 30 may packetize the data before storing the data in buffer 29, after the data is moved out of buffer 29, or while the data is being moved out of buffer 29. Packetizing may include defining a packet payload from the data and adding one or more headers to the packet payload.

In some implementations, all of the functionality of controller 30 may be implemented via software executed by DSP 18.

ATE 12 is in communication with computer 14. Computer 14 may be any type of processing device including, but not limited to, a conventional personal computer (PC), a desktop device or a hand-held device, a multiprocessor computer, a microprocessor-based or programmable consumer electronics device, a mini-computer, a mainframe computer, and/or a personal mobile computing device. In the example of FIG. 1, computer 14 contains one or more processors, referred to simply as "processor 50", and memory 32. Memory 32 stores software 34 that is executed by processor 50 to test DUTs in ATE 12.

Figure 2:
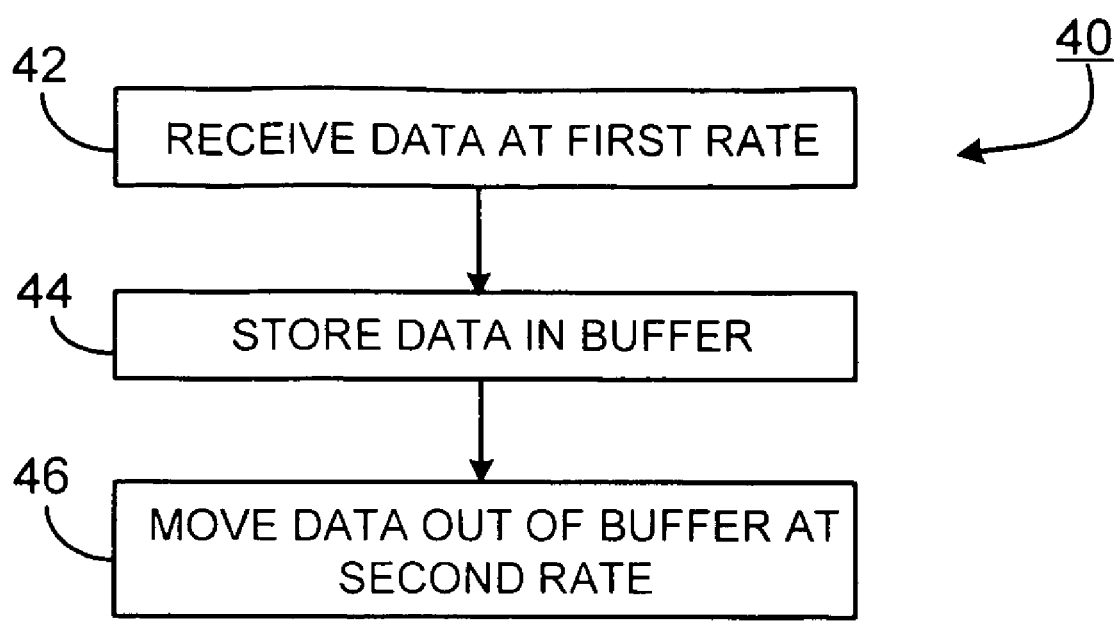
FIG. 2 is a flowchart showing actions performed during a site loop executed on the computer in the test system.

Software 34 includes a test program 36 for executing tests on data received from the DUTs and a site manager 38 for communicating with hardware driver(s) 26 on ATE 12. In response to a test, data is transferred from the DUTs back to ATE 12. The data may correspond, e.g., to results of the tests, to actions taken by the DUT in response to stimuli provided by ATE 12, and/or communications from the DUT. FIG. 2 shows a process 40 by which controller 30 handles data coming from DUTs in sites 16a to 16d.

As shown in FIG. 2, controller 30 receives data from a DUT in a site 16a to 16d, and stores the data in one or more of buffers, such as buffer 29. In this implementation, there is one buffer per data channel, which may, or may not, mean one buffer per site. Assuming, for the sake of explanation, that there is one buffer per site (i.e., one site corresponds to one data channel), controller 30 stores data from site 16a in buffer 29. Controller 30 would store data from site 16b in buffer 29b; site 16c in buffer 29c, and so on. Controller 30 receives (42) the data at a first rate, which may be dictated by the transfer rate of the DUT. Controller 30 stores (44) the received data in buffer 29. The data may be stored temporarily as buffer 29 fills or comes close to filling. At a predefined point, e.g., when buffer 29 reaches a predefined fill level, controller 30 moves (46) a block of data from buffer 29 to DSP 18. The data is moved at a second rate out of buffer 29. The first and second rate may or may not be equal depending on the transfer rate of the DUT and the transfer rate to the DSP 18. DSP 18 may analyze the data by performing one or more tests on the received data. In this example, DSP 18 may perform a bit error test on the received data. As noted above, one type of bit error test requires a data capture size of $2^{31}$ bits. Controller 30 moves data into, and out of, buffer 29 in order to approximate a continuous stream of $2^{31}$ bits.

In particular, controller 30 moves (46) data out of buffer 29 at a second rate that is about equal to, or that exceeds, the first rate. This is done in order to ensure that buffer 29 does not overflow and, as a result, lose data received from DUT 31. That is, if data from buffer 29 were removed too slowly, buffer 29 would continue to fill, eventually overflowing, which would result in data loss. In this example, the second rate is determined based on the first rate (the sample rate), a number of samples that constitute the input data, a number of channels over which data is transmitted from the DUT, a number of samples that constitute the output data. The second rate may be about equal to, or more than, the sample rate of the DUT multiplied by the number of input samples and by the number of channels of data being received by the buffer, divided by the number of output samples. This is illustrated by the equations relating to buffer size:

> Output data rate*number of output samples≧buffer size≧input data rate*number of input samples*number of channels per buffer.

As noted above, controller 30 may packetize data received from a DUT before or after that data is stored in a buffer. As noted, packetizing may include adding headers to the data and/or organizing the data according to a particular protocol.

Process 40 may be repeated by controller 30 for each of buffers 29b, 29c, etc. and corresponding sites of ATE 12.

It is noted that process 40 is not limited to use with the hardware and software described above. Process 40 can be implemented in digital electronic circuitry, or in computer hardware, firmware, software, or in combinations thereof.

Process 40 can be implemented, at least in part, via a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps associated with implementing process 40 can be performed by one or more programmable processors executing one or more computer programs to perform the functions of the site loops. All or part of process 40 can be implemented as, special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer include a processor for executing instructions and one or more memory devices for storing instructions and data.

It is noted that process 40 is not limited to use in an ATE context or to use with DSPs that perform the bit error test or a version thereof. Likewise, process 40 is not limited to use with ATEs having multiple sites, but rather can be used with any type of ATE.

Elements of different embodiments described herein may be combined to form other embodiments not specifically set forth above. Other embodiments not specifically described herein are also within the scope of the following claims.

What is claimed is:

1. A method for use with automatic test equipment (ATE) having a site that holds a device under test (DUT), the method comprising:
   receiving input data from the DUT at a first rate;
   storing the input data in a buffer;
   moving the input data out of the buffer as output data at a second rate, the second rate being greater than the first rate, the output data being moved toward a processing device; and
   performing a test on the output data at the processing device;
   wherein the first rate comprises a first sampling rate for the input data, and the second rate comprises a second sampling rate for the output data; and
   determining the second rate in order to prevent overflow of the buffer and loss of the input data; wherein the second rate is greater than the first rate multiplied by a number of samples of the input data and by a number of channels over which input data is transmitted from the DUT, divided by a number of samples of the output data.

2. The method of claim 1, wherein the ATE comprises a second site that holds a second DUT, and wherein the method further comprises:
   receiving second input data from the DUT at a third rate;
   storing the second input data in a second buffer that corresponds to the second site;
   moving the second input data out of the second buffer as second output data at a fourth rate, the fourth rate being greater than or equal to the third rate, the second output data being moved toward the processing device; and
   performing a test on the second output data at the processing device.

3. The method of claim 1, wherein the buffer comprises a first-in, first-out (FIFO) buffer.

4. The method of claim 3, wherein the FIFO buffer accommodates eight megasamples of data, where a sample comprises sixteen bits of data.

5. The method of claim 1, further comprising packetizing the output data before the output data reaches the processing device.

6. The method of claim 5, wherein the output data is packetized as the output data is moved out of the buffer.

7. The method of claim 1, wherein the test comprises a bit error test.

8. Automatic test equipment (ATE) comprising:
   a site that holds a device under test (DUT);
   a buffer; and
   a controller that executes instructions to:
     receive input data from the DUT at a first rate;
     store the input data in the buffer;
     move the input data out of the buffer as output data at a second rate, the second rate being greater than the first rate, the output data being moved toward a processing device; and
     determine the second rate in order to prevent overflow of the buffer and loss of the input data;
   wherein the processing device performs a test on the output data; and
   wherein the first rate comprises a first sampling rate for the input data, and the second rate comprises a second sampling rate for the output data; and
   wherein the second rate is greater than the first rate multiplied by a number of samples of the input data and by a number of channels over which input data is transmitted from the DUT, divided by the number of samples of the output data.

9. The ATE of claim 8, further comprising:
   a second site that holds a second DUT; and
   a second buffer;
   wherein the controller executes instructions to:
     receive second input data from the DUT at a third rate;
     store the second input data in the second buffer; and
     move the second input data out of the second buffer as second output data at a fourth rate, the fourth rate being greater than or equal to the third rate, the second output data being moved toward the processing device;
   wherein the processing device performs a test on the second output data.

10. The ATE of claim 8, wherein the buffer comprises a first-in, first-out (FIFO) buffer.

11. The ATE of claim 10, wherein the FIFO buffer accommodates eight megasamples of data, where a sample comprises sixteen bits of data.

12. The ATE of claim 8, wherein the controller executes instructions to packetize the output data before the output data reaches the processing device.

13. The ATE of claim 12, wherein the controller packetizes the output data as the output data is moved out of the buffer.

14. The ATE of claim 8, wherein the test comprises a bit error test.

15. A testing system comprising:
   a testing apparatus comprising:
     a site that holds a device under test (DUT);
     a buffer; and
     a controller that executes instructions to:
       receive input data from the DUT at a first rate;
       store the input data in the buffer;
       move the input data out of the buffer as output data at a second rate, the second rate being greater than the first rate; and
       determine the second rate in order to prevent overflow of the buffer and loss of the input data; and
   a computing device comprising:
     memory to store computer code; and
     a processing device to execute the computer code to:

receive the output data; and
perform a test on the output data;
wherein the first rate comprises a first sampling rate for the input data, and the second rate comprises a second sampling rate for the output data; and
wherein the second rate is greater than the first rate multiplied by a number of samples of the input data and by a number of channels over which input data is transmitted from the DUT, divided by the number of samples of the output data.

16. The testing system of claim 15, wherein the buffer comprises a first-in, first-out (FIFO) buffer, and wherein the FIFO buffer accommodates eight megasamples of data, where a sample comprises sixteen bits of data.

* * * * *